(12) United States Patent
Poeppelman et al.

(10) Patent No.: US 6,175,941 B1
(45) Date of Patent: Jan. 16, 2001

(54) ERROR CORRECTION APPARATUS AND ASSOCIATED METHOD UTILIZING PARELLEL PROCESSING

(75) Inventors: Alan D. Poeppelman; Mark D. Rutherford, both of Fort Collins, CO (US)

(73) Assignee: LSI Logic Corporation, Milpitas, CA (US)

( * ) Notice: Under 35 U.S.C. 154(b), the term of this patent shall be extended for 0 days.

(21) Appl. No.: 09/207,349

(22) Filed: Dec. 8, 1998

(51) Int. Cl.[7] .................... H03M 13/00; G06F 15/00
(52) U.S. Cl. .................. 714/757; 714/762; 714/768; 714/785; 708/492
(58) Field of Search .................. 714/755, 756, 714/757, 763, 766, 767, 770–761, 762, 781–787; 708/492

(56) References Cited

U.S. PATENT DOCUMENTS

| 4,105,999 | 8/1978 | Nakamura | 714/757 |
|---|---|---|---|
| 4,597,083 * | 6/1986 | Stenerson | 714/753 |
| 4,642,808 * | 2/1987 | Baggen | 714/784 |
| 4,747,103 | 5/1988 | Iwamura et al. | 714/755 |
| 4,791,641 | 12/1988 | Hillis et al. | 714/757 |
| 4,875,211 * | 10/1989 | Murai et al. | 714/784 |
| 4,899,341 | 2/1990 | Tomimitsu | 714/757 |
| 5,315,600 | 5/1994 | Iwamura et al. | 714/757 |
| 5,504,758 | 4/1996 | Inoue et al. | 714/775 |
| 5,570,378 | 10/1996 | Inoue et al. | 714/785 |
| 5,687,181 | 11/1997 | Suemura et al. | 714/757 |
| 5,812,564 * | 9/1998 | Bonke et al. | 714/769 |
| 5,983,389 * | 11/1999 | Shimizu | 714/781 |

* cited by examiner

Primary Examiner—Emmanuel L. Moise

(57) ABSTRACT

Apparatus, and an associated method, for performing error-correction operations to correct errors in a block of block-encoded data. Two ALUs are operable in parallel to perform finite-field mathematical operations and to calculate addresses used pursuant to the error-correction calculations. Instructions pursuant to which the ALUs are operable are stored in a memory device. The instructions are retrieved during operation of error-correcting calculations. The manner by which the error-correcting apparatus operates is alterable by appropriate alteration of the instructions stored at the memory device.

21 Claims, 6 Drawing Sheets

ERROR CORRECTION APPARATUS AND ASSOCIATED METHOD UTILIZING PARELLEL PROCESSING

The present invention relates generally to a manner by which to correct errors contained in digital data, such as the data forming elements of a block of block-encoded data. More particularly, the present invention relates to apparatus, and an associated method, for performing error correction upon a block of block-encoded data.

Operation of an embodiment of the present invention provides both the speed-advantages associated with hardware-implemented error-correction apparatus and also the flexibility associated with software-implemented error-correction apparatus. That is to say, an embodiment of the present invention exhibits the speed of a hardware implementation, and also the adaptability associated with a software implementation.

In one implementation, error correction is provided for blocks of data retrieved from a data storage and transmission system in which data stored at a computer mass storage device, such as a disk drive or the like, is retrieved during system operation. The data blocks are encoded by Reed-Solomon ECC (error correcting code). Effectuation of error correction is provided by two ALUs (arithmetic logic units) operating in parallel. The ALUs are at least selectively provided with instructions retrieved by a sequencer from a memory device. Instructions stored in the memory device are replaceable to provide for system flexibility while the parallel operation of the ALUs provide for high-speed error-correction operations.

BACKGROUND OF THE INVENTION

Advancements in digital technologies have permitted the development, and implementation, of many new products. Products pertaining to, and including, digital processing circuitry, are exemplary of products possible as a result of such advancements.

Repetitive functions can be carried out by digital processing circuitry at rates significantly more rapidly than the manual performance of such functions. The rapid rate at which the digital processing circuitry is able to repeatedly perform such functions has permitted activities, previously considered impractical, to be readily implementable.

Processing of large amounts of data is, e.g., advantageously effectuated through the use of a product, including, or formed of, digital processing circuitry. For instance, in a computer system, data is transferred between peripheral devices and a CPU (central processing unit). In processing of the data, data is read from, or written to, data storage locations in successive read and write operations.

The data that is processed is in digital form. That is to say, the data is stored in the form of binary bits. The binary bits forming the data are transferred when reading or writing the data to effectuate the processing operations. Errors are sometimes introduced during the transfer of the data. The errors are introduced as a result of, for example, channel distortion or noise. The effects of the data storage locations at which the data is stored can also introduce errors into the data.

To ensure data integrity, the errors in the data must typically be corrected. Encoding techniques are sometimes utilized to encode data prior to its transfer. Such encoding of the data facilitates error correction of the data, subsequent to its transfer. Decoding of the data is performed to recreate the value of the data prior to its encoding and transfer.

Various encoding schemes have been developed and used to encode data. Block-encoding schemes by which blocks of digital data are encoded, for example, are oftentimes utilized in mass storage systems. Reed-Solomon coding is exemplary of a block-encoding scheme sometimes utilized to encode digital data. Standardized encoding schemes have been set forth, for instance, for the encoding of blocks of data stored on the optical storage devices, such as CD-ROM storage devices. In such storage devices, data is formatted into blocks formed of two-dimensional arrays of data. The blocks of data include ECC (error correction code) as a portion thereof. The ECC is utilized during error-correction operations to detect data errors contained in the block of data.

Error-correction operations however, are computationally-intensive. As products and systems in which data is transferred cause data transfer to be effectuated at quicker rates, the rates at which error-correction operations must be performed correspondingly must be increased. Some conventional error-correction operations are performed by execution of the ECC error-correction algorithms by a general-purpose microprocessor or a specialized, ECC-processor. The use of software algorithms to effectuate ECC error-correction operations permit system flexibility as the software algorithms can be substituted with others depending upon the error-correction operations to be performed. That is to say, software implementations of ECC operations are easily alterable, or replaceable. But, execution of a software algorithm is inherently serial. Rates at which error-correction operations utilizing conventional software algorithms, executable by processors, are relatively slow because of the necessary, serial execution of the algorithms.

Other, conventional ECC operations are hardware-implemented. That is to say, dedicated hardware is provided to implement error-correction operations. Such hardware implementations are more readily able to perform error-correction operations at high data rates. But, hardware implementations are not adaptable to changes.

Conventional, software-implemented error-correction apparatus and methods, while advantageously flexible, are relatively slow. And, conventional, hardware-implemented error-correction apparatus and methods, while relatively fast, are relatively inflexible.

A manner by which to utilized the advantages of both software- and hardware-implemented error-correction apparatus and methods would therefore be advantageous.

It is in light of this background information related to error-correction operations that the significant improvements of the present invention have evolved.

SUMMARY OF THE INVENTION

The present invention, accordingly, advantageously provides apparatus, and an associated method, for performing error correction upon a block of block-encoded data.

An embodiment of the present invention advantageously provides both the speed-advantages associated with hardware-implemented error-correction operations and also the flexibility associated with software-implemented error-correction operations. Thereby, a manner is provided by which to effectuate error-correction operations at increased rates while also permitting flexibility to permit alteration in the manner by which error-correction operations are performed.

In an exemplary implementation, error correction is provided for blocks of data retrieved from a data storage and transmission system, such as a system in which data stored at a CD-ROM device is retrieved during system operation. Each of the blocks of data are encoded utilizing an ECC (error correction code), e.g., a Reed-Solomon, RS1, ECC. Error-correction operations are performed by two ALUs (arithmetic logic units) operating in parallel and together in conjunction with a sequencer. The sequencer retrieves instructions from a memory device and provides such instructions to the ALUs, at least selectively, thereby to effectuate error-correction operations. By operating the two ALUs in parallel, error-correction operations are effectuated quickly. And, because instructions determinative of operation of the ALUs stored in the memory device are replaceable, system flexibility is provided.

In these and other aspects, therefore, apparatus, and an associated method, error-corrects a block digital data encoded according to a selected encoding technique. A finite-field ALU is coupled selectively to receive an error-location indication and an error-syndrome indication. The finite-field ALU performs finite-field mathematical calculations. An integer ALU is operable in parallel with the finite-field ALU. The integer ALU performs address calculations such as to determine the addresses of errors in a buffer and to determine addresses of syndromes which are to be adjusted. The integer ALU also computes offsets for CRC calculations. A sequencer is coupled to the finite-field ALU and to the integer ALU. The sequencer is at least selectively operable to cause application of instructions to the finite-field ALU and to the integer ALU. The finite-field ALU and the integer ALU together are operable to correct data errors of the block of data.

A more complete appreciation of the present invention and the scope thereof can be obtained from the accompanying drawings which are briefly summarized below the following detailed description of the presently-preferred embodiments of the invention, and the appended claims.

DETAILED DESCRIPTION

Figure 1:
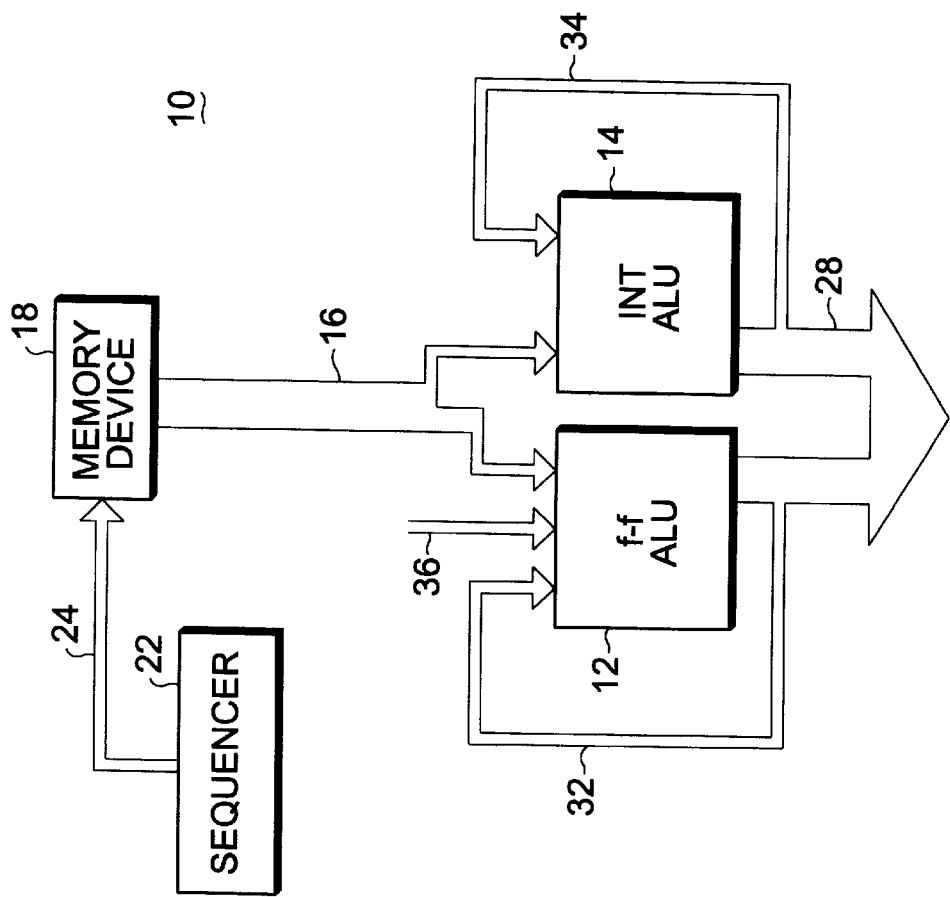
FIG. 1 illustrates a functional block diagram of the ECC error-correction apparatus of an embodiment of the present invention.

Turning first to FIG. 1, an ECC error-correcting apparatus, shown generally at 10, is operable to detect and correct errors contained in data elements of a block of encoded data. That is to say, when errors are deteced, attempts are made to correct such errors. The apparatus 10 shown in FIG. 1 is constructed to optimize error correcting of data encoded according to a single-correction, Reed-Solomon coding scheme, i.e., RS1. In other embodiments, analogous structure provides for error-correction operations of data encoded in other manners.

The ECC error-correcting apparatus 10 includes a finite-field ALU (arithmetic logic unit) 12 and an integer ALU (arithmetic logic unit) 14. The ALUs 12 and 14 are positioned to permit their parallel operation to perform error-correcting functions.

Both the ALU 12 and the ALU 14 are coupled to receive instructions provided on the lines 16. The instructions provided to the ALUs on the lines 16 are retrieved from a memory device 18. The instructions stored in the memory device 18 are caused to be "fetched" by a sequencer 22 which is coupled to the memory device 18 by way of the lines 24.

Values generated during operation of the ALUs 12 and 14 are generated on the lines 28. Selected values generated by the ALUs 12 and 14 are provided by way of feedback lines 32 and 34 to the ALUs 12 and 14, respectively. The ALU 12 is further coupled to receive externally-generated inputs, such as syndrome values, conventionally provided to error-correction apparatus, here represented to be provided to the ALU 12 by way of the lines 36.

The ALUs 12 and 14, being hardware implementations, permit error-correction calculations to be performed quickly. And, because the ALUs are operable in parallel with one another, error-correction calculations performed at the respective elements are performed at even quicker rates. Further, because the instructions provided to the ALUs 12 and 14 to permit their operation to effectuate error-correction calculations are stored at the memory device 18, the stored instructions can be written over or amended, as necessary, to alter operation of the error-correction operations of the apparatus 10, the apparatus 10 also thereby provides flexibility of operation.

Figure 2:
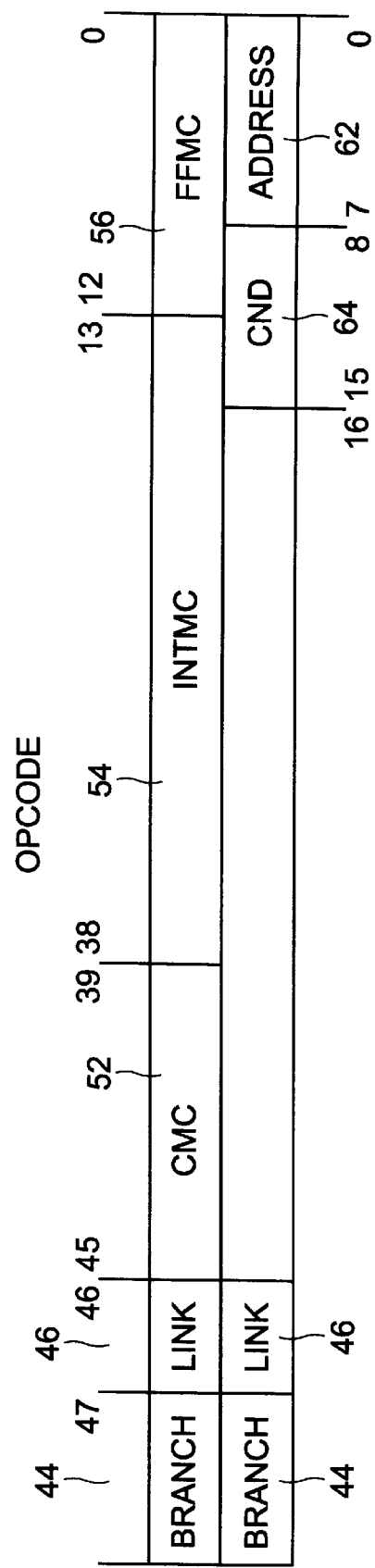
FIG. 2 illustrates the format of an exemplary operational code used during operation of the apparatus shown in FIG. 1.

FIG. 2 illustrates the format of the operational code pursuant to which the apparatus 10 shown in FIG. 1 is operable. The operational code is formatted into 48-bit code portions. The operational code takes either of two forms depending upon the value of a branch bit 44. When the branch bit 44 is of a first value, here a "zero" value, the operational code is in a normal form, and when the branch bit is of a second value, here a "one" value, the operational code is of a second, branch form. The normal form of the operational code is indicated by the top line in the Figure, and the branch form of the operational code is indicated by the second line in the Figure.

A second bit of the operational code forms a link bit 46. The link bit 46 permits a current address to be saved in a linkage register (not shown in the Figures) when the branch bit 44 is set. Program execution of the apparatus 10 returns to the address contained in the linkage register when the link bit is set and the branch bit is reset.

The normal form of the operational code is shown to include a seven-bit field 52 forming a control micro-code used for miscellaneous control functions of the apparatus 10. A twenty-six-bit field 54 forms an integer field micro-code portion operable to control the integer ALU 14, shown in FIG. 1. And, the normal form of the operational code further includes a thirteen-bit finite-field micro-code portion 56 operable to control operation of the finite-field ALU 12, shown in FIG. 1.

The branch form of the operational code includes an eight-bit field 62 containing a branch address and an eight-bit field 64 containing a branch condition. Values of the operational code are determinative of operation of the apparatus 10. When in the normal form, values of the portions 54 and 56, applied to the ALUs 14 and 12, respectively, operably control their functioning. Because the operational code is formed of data bits formatted into a particular format, the values of such data can be altered, such as writing over lines of the operational code, the apparatus 10 is updateable, or otherwise permitting of flexible operation.

Figure 3:
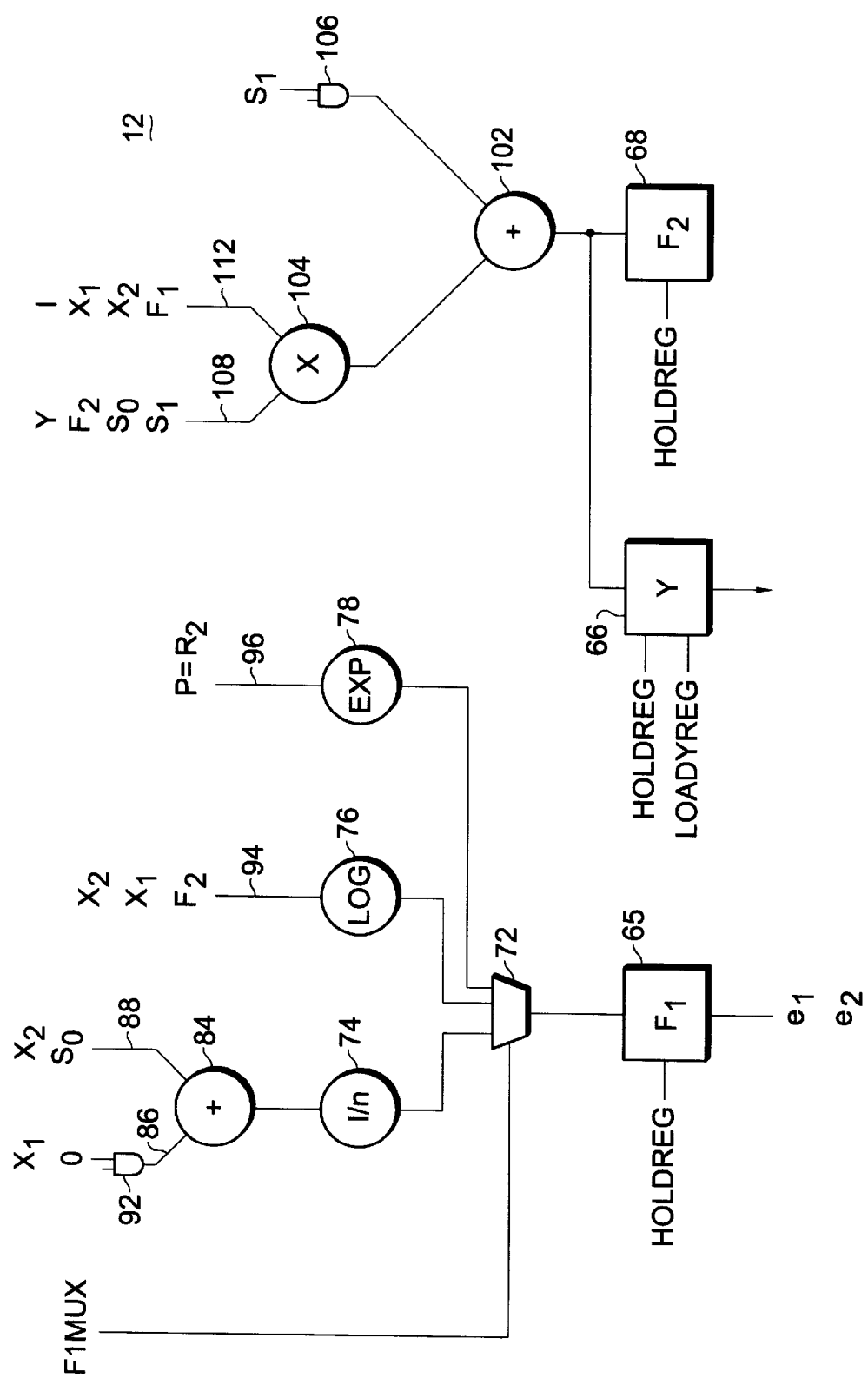
FIG. 3 illustrates a functional block diagram of a finite-field ALU which forms a portion of the apparatus shown in FIG. 1.

FIG. 3 illustrates the finite-field ALU 12 which forms a portion of an embodiment of the present invention. The ALU 12 is here shown to include three registers. A first register 65 identified by $F_1$, a second register 66, identified by Y, and a third register 68 identified by $F_2$.

The register 65 is coupled to receive values of signals passed by a multiplexor 72. The multiplexor 72 is coupled to operators 74, 76, and 78. The operator 74 performs reciprocal operations; the operator 76 performs logarithmic operations, and the operator 78 performs exponential operations. The multiplexor 72 is controlled by an input signal generated on the line 82. The operator 74 is further coupled to a summation operator 84 which is coupled to receive input values by way of the lines 86 and 88. An error locator, $X_1$, is provided on the line 86, and an error locator, $X_2$, or a syndrome, $S_0$, value is provided on the line 88. The line 86 receives input values which are first gated by a gate 92. The operator 76 is coupled to receive input values by way of the line 94, and the operator 78 is coupled to receive input values by way of the line 96. Error locators $X_1$ and $X_2$ or the contents of the register 64 are provided on the line 94. And, the contents of a register of the ALU 14 are provided on the line 94.

The registers 66 and 68 of the ALU 12 are coupled to a summation operator 102. The summation operator receives input values generated by a multiplier operator 104 and input signals gated by a gate 106. The multiplier 104 receives input signals by way of the lines 108 and 112. That is to say, line 108 is coupled, selectively, to receive the values Y and $F_2$ stored at the registers 66 and 68, respectively, and the syndrome values $S_0$ and $S_1$. Line 112 is coupled selectively, to receive values $F_1$ stored at the register 65, the error locators $X_1$ and $X_2$, and a constant value, here a "1" value. And, a value of the syndrome $S_1$ is provided to an input to the gate 106.

The finite-field ALU is operable to perform Galois field mathematical operations and is capable of performing two finite-field math operations per cycle. The values applied to the various input lines of the ALU are selectively provided by way of the micro-code portion 56 of the operational code shown in FIG. 2, externally-generated inputs, and inputs provided by way of the feedback loop 32, shown in FIG. 1.

Figure 4:
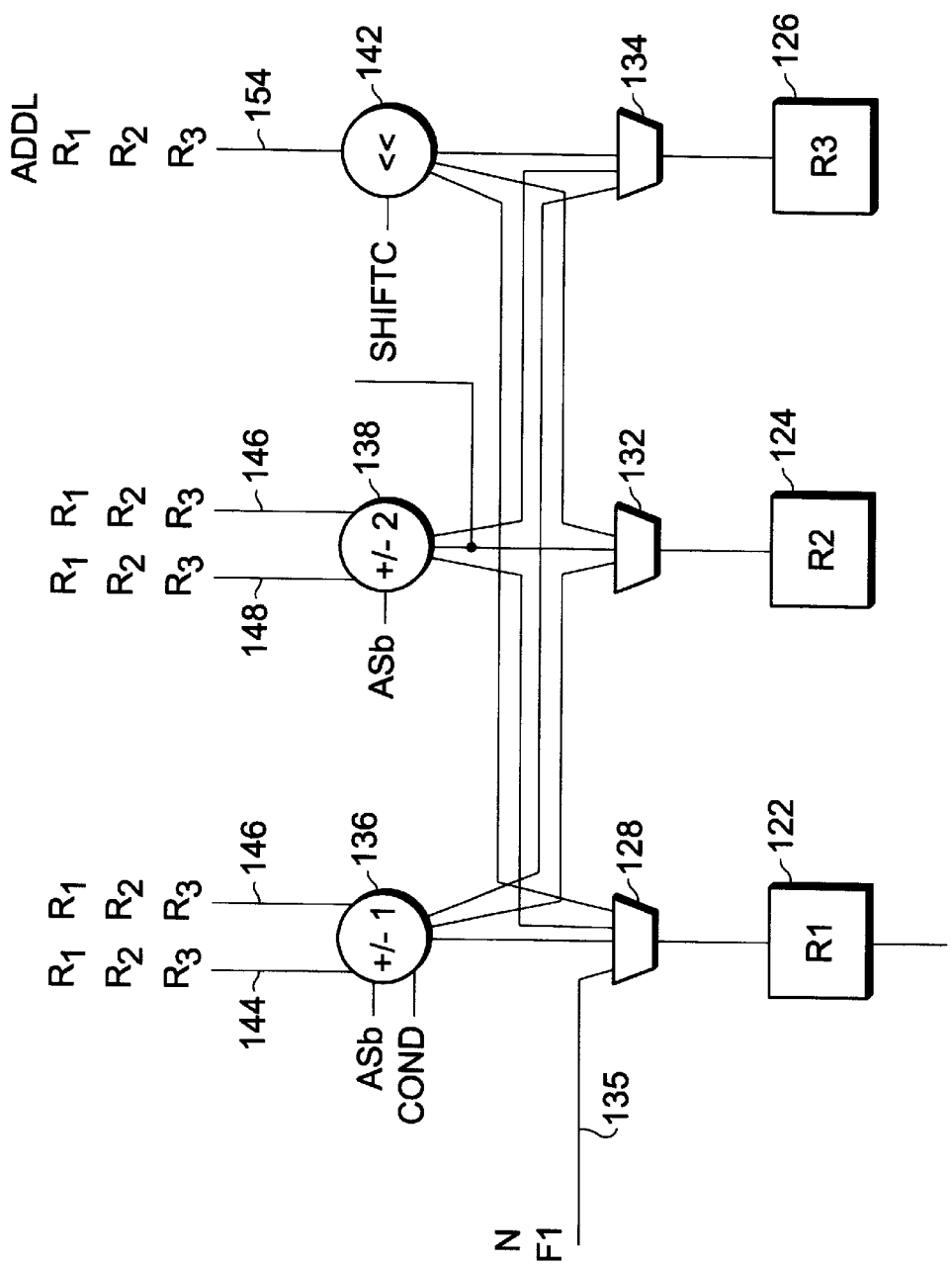
FIG. 4 illustrates a functional block diagram of a integer ALU which forms a portion of the apparatus shown in FIG. 1.

FIG. 4 illustrates the integer ALU 14 forming a portion of the apparatus of an embodiment of the present invention. The ALU 14 includes three registers capable of storing values thereat. Namely, the ALU includes a register 122, identified by R1, a register 124, identified by a R2, and a third register 126, identified by R3. The register 122 is operable to store values provided thereto by way of a multiplexor 128; the register 124 is coupled to receive values provided thereto by way of a multiplexor 132; and the register 126 is coupled to receive values provided thereto by way of a multiplexor 134. Each of the multiplexors 128–134 is coupled to an input line 135. The values of $F_1$, stored at the register 65 (shown in FIG. 3), and N, an interleave number, are selectively generated on the line 135. The multiplexors are further coupled to a conditional add/subtract (+/−) operator 136, an add/subtract (+/−) operator 138, and a "shift left" operator 142. The operator 136 is coupled to receive input values on the lines 144 and 146; the operator 138 is coupled to receive input values on the lines 148 and 152; and the operator 142 is coupled to receive input values on the line 154. The lines 144–146, 148–152, and 154 coupled to respective ones of the operators 136, 138, and 142, are coupled, such as in a feedback arrangement, to receive values stored at respective ones of the registers 122, 124, and 126.

The integer ALU 14 is operable to perform one +/− operation, one conditional +/− operation, e.g., for the performance of modulus operations, and one shift operation per cycle. Each operator 136–142 can take any register or a constant as an input value on the lines provided to the operators. Values stored at the register 122 can also be provided to the finite-field ALU 12 (shown in FIGS. 1 and 3).

Figure 5:
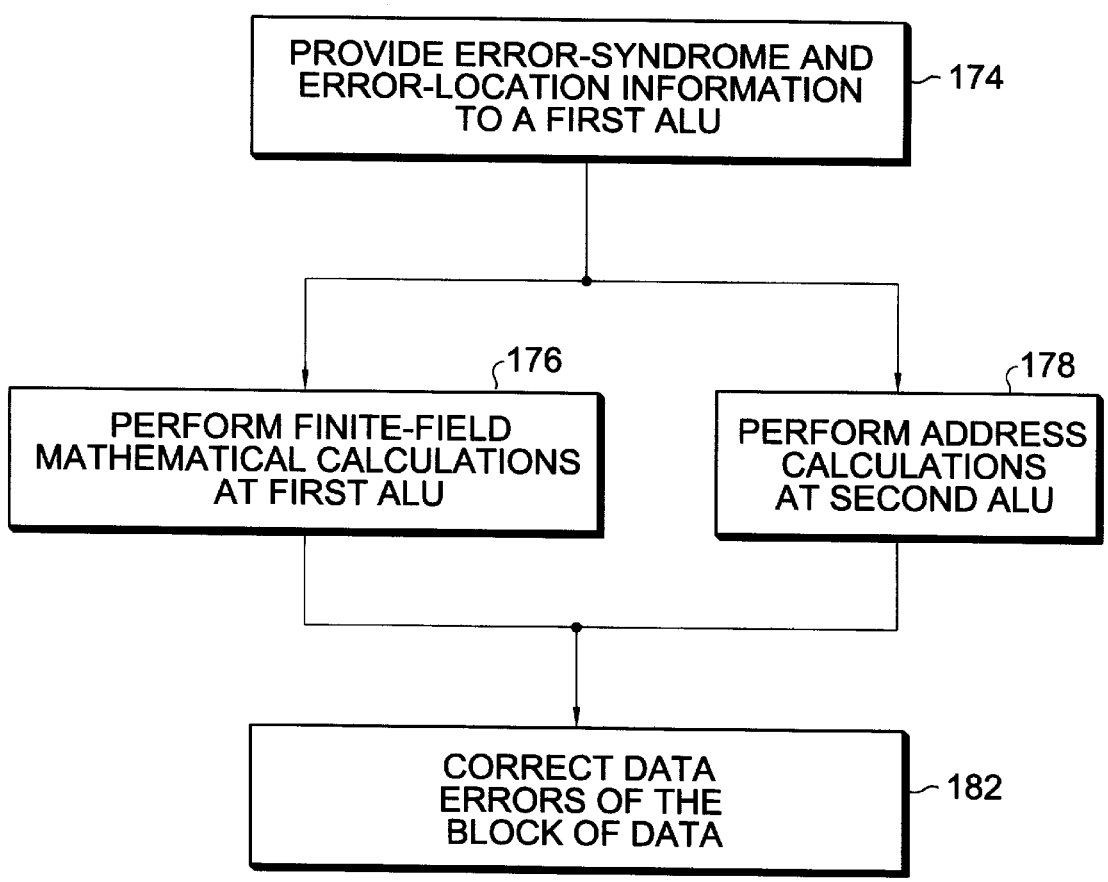
FIG. 5 illustrates a method flow diagram listing the method steps of the method of operation of an embodiment of the present invention.

FIG. 5 illustrates a method, shown generally at 172, of an embodiment of the present invention. The method error-corrects a block of digital data encoded by a selected encoding technique to include an ECC portion. First, and as indicated by the block 174, error-location information and error-syndrome information is selectively provided to a first ALU. Then, and as indicated by the block 176, finite-field mathematical calculations are performed at the first ALU. Concurrent therewith, and as indicated by the block 178, address calculations are performed at a second ALU. The address calculations performed at the second ALU are calculated in parallel with the mathematical calculations performed at the first ALU. Then, and as indicated by the block 182, data errors of data of the block of digital data are corrected responsive to the finite-field mathematical calculations and the address calculations.

Because of the parallel operation of the finite-field and integer ALUs, error-correction calculations are performed quickly. And, as instructions provided to the ALUs are fetched by a sequencer from a memory device, the manner by which the ALUs are operable to perform error-correction operations is readily changeable by changing the contents of the memory device.

Figure 6:
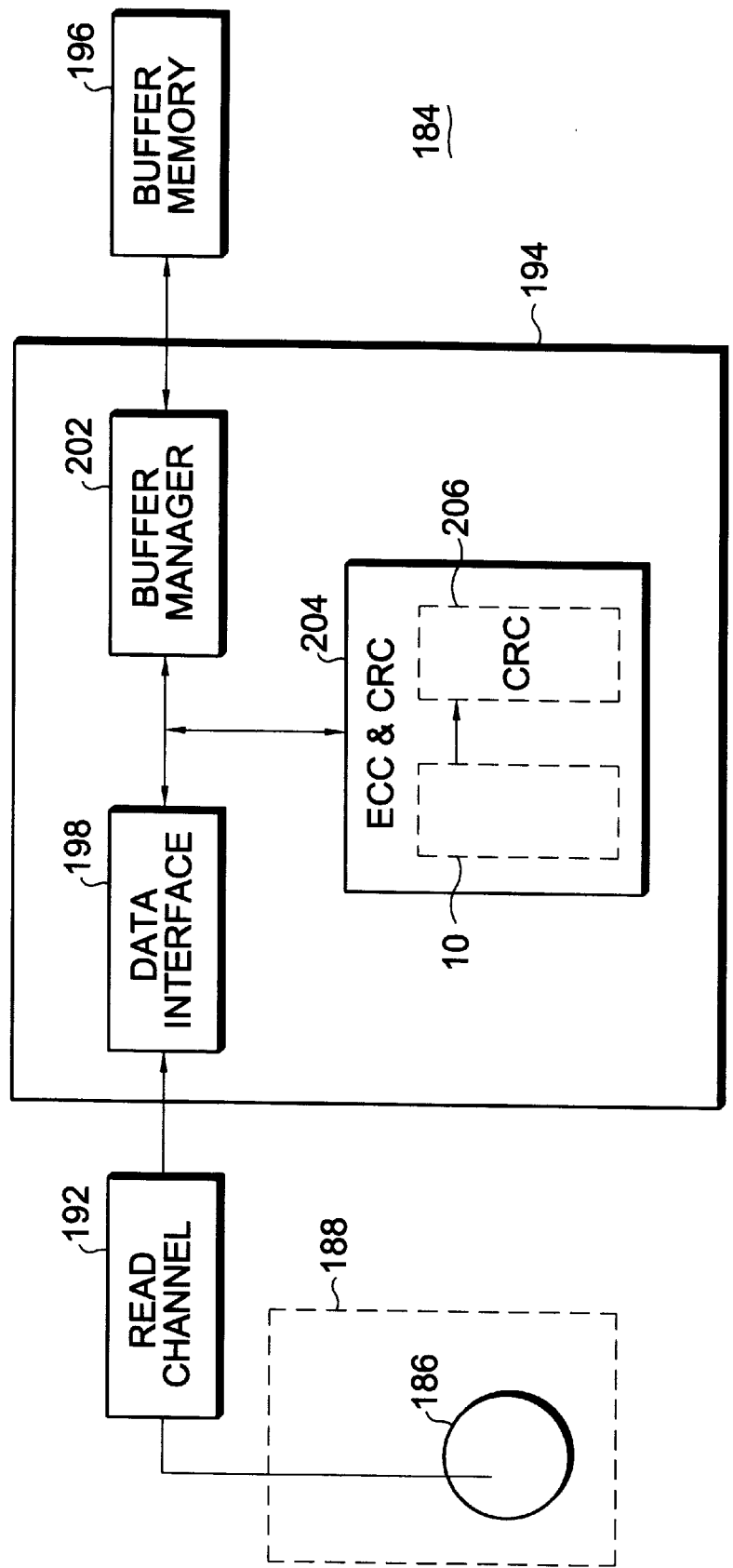
FIG. 6 illustrates a functional block diagram of the apparatus shown in FIG. 1, together with a storage device from which blocks of data are retrieved.

FIG. 6 illustrates a portion of a computer system, shown generally at 184, in which an embodiment of the present invention is operable. The illustrated portion of the computer system 184 is here shown to include a CD-ROM memory storage device 186 forming a portion of an optical drive 188. The drive 188 is coupled by way of a read channel 192 through a data card 194. The data card 194, in turn, is coupled to a buffer memory 196.

The data card 194 includes a CD data interface 198 coupled by way of the read channel 192 to the optical drive 188. The data card 194 further includes a buffer manager 202, coupled between the data interface 198 and the buffer memory 196. And, the data card 194 further includes an error corrector and data integrity identifier 204 coupled to receive the data read from the storage medium 186 by way of the read channel 192 and interface 198. The corrector and the verifier 204 is here shown to include the apparatus 10 and a CRC adjuster 206.

During operation of the computer system 184, data is read from the CD-ROM storage medium 186 and provided to the buffer memory 196. As the data is read from the storage medium 186, the data is provided to the corrector and verifier 204. The elements 10 and 206 are operable, as the data is read, to perform ECC error-correction calculations upon the data. And, once error correction has been effectuated, the CRC adjuster 206 is operable to calculate CRC remainders.

Thereby, error correction is provided for blocks of data retrieved by the storage medium and read into the buffer memory. The apparatus 10 is operable to calculate the error-location and magnitude of errors contained in the block of data. Therefore, the apparatus 10 is operable to calculate the address of the error location of the data written to the buffer memory, to write the correction to the buffer memory, as well as also to write the correction to the CRC adjuster 206 adjust syndromes and clear erasure flags. Because error-correction operations are performed by the two ALUs operating in parallel, error correction is performed at high speeds. And, because of the use of the memory device at which instructions are stored, the apparatus is alterable, as desired, by altering the contents of the memory device.

The previous descriptions of are preferred examples for implementing the invention, and the scope of the invention should not necessarily be limited by this description. The scope of the present invention is defined by the following claims.

We claim:

1. ECC (error correcting code) error-correcting apparatus for error-correcting a block of digital data encoded according to a selected encoding technique, said ECC error-correcting apparatus comprising:
    a finite-field ALU coupled selectively to receive an error-location indication and an error-syndrome indication, said finite-field ALU for performing finite-field mathematical calculations;
    an integer ALU operable in parallel with said finite-field ALU, said integer ALU at least for performing address calculations; and
    a sequencer coupled to said finite-field ALU and to said integer ALU, said sequencer at least selectably operable to cause application of instructions to said finite-field ALU and to said integer ALU, said finite-field ALU and said integer ALU together operable to correct data errors of the block of data.

2. The ECC error-correcting apparatus of claim 1 wherein said finite-field ALU further comprises a first register and at least a second register.

3. The ECC error-correcting apparatus of claim 2 wherein said finite-field ALU further comprises a first register, a second register, and at least a third register, values of the mathematical calculations performed at said finite-field ALU selectively stored at said first, second, and third registers, respectively.

4. The ECC error-correcting apparatus of claim 3 wherein the mathematical calculations performed at said finite-field ALU include logarithmic operations, results of the logarithmic operations storable at the first register.

5. The ECC error-correcting apparatus of claim 3 wherein the mathematical calculations performed at said finite-field ALU include exponential operations, results of which are storable at the first register.

6. The ECC error-correcting apparatus of claim 3 wherein the mathematical calculations performed at said finite-field ALU include reciprocal operations, results of which are storable at the first register.

7. The ECC error-correcting apparatus of claim 3 wherein the mathematical calculations performed at said finite-field ALU include multiply-add operations, results of which are storable at the second register.

8. The apparatus of claim 3 wherein said finite-field ALU is operable to calculate error magnitudes of data error of data of the block of data, results of which are stored at the third register.

9. The apparatus of claim 3 wherein said finite-field ALU is coupled to said integer ALU to permit values stored at the first register of said finite-field ALU to be provided to said integer ALU.

10. The ECC error-correcting apparatus of claim 1 wherein said integer ALU further comprises a first register, a second register, and at least a third register, values of the address calculations performed at said integer ALU selectively stored at said first, second, and third registers, respectively.

11. The ECC error-correcting apparatus of claim 10 wherein said integer ALU is operable to perform add/subtract operations.

12. The ECC error-correcting apparatus of claim 10 wherein said integer ALU is operable to perform conditional add/subtract operations.

13. The ECC error-correcting apparatus of claim 10 wherein said integer ALU is operable to perform shift operations.

14. The ECC error-correcting apparatus of claim 10 wherein said integer ALU is coupled to said finite-field ALU to permit values stored at the first register of said integer ALU to be provided to said finite-field ALU.

15. The ECC error-correcting apparatus of claim 10 wherein the first, second, and at least third registers of said integer ALU are selectively coupled in a feedback arrangement with input terminals of said integer ALU.

16. The ECC error-correcting apparatus of claim 1 wherein said sequencer, said integer ALU, and said finite-field ALU are together operable to calculate both an error location and an error magnitude of each data error of the block of data.

17. The ECC error-correcting apparatus of claim 16 wherein said sequencer, said integer ALU, and said finite-field ALU are further together operable to correct each data error by writing over the data error with a corrected value, the corrected value formed responsive to calculations of the error location and the error magnitude.

18. The ECC error-correcting apparatus of claim 1 further comprising a memory device for storing instructions therein, the instructions stored at said memory device retrievable by said sequencer for application selectably to said finite-field ALU and to said integer ALU.

19. The ECC error-correcting apparatus of claim 1 wherein said integer ALU further computes an offset for a CRC calculation.

20. A method for error-correcting a block of digital data encoded by a selected encoding technique to include an ECC (error correcting code) portion, said method comprising:
    selectively providing error-location information and error-syndrome information to a first ALU;
    performing finite-field mathematical calculations at the first ALU;
    performing address calculations at a second ALU, the address calculations performed at the second ALU calculated in parallel with the mathematical calculations performed at the first ALU; and
    correcting data errors of data of the block of digital data responsive to the finite-field mathematical calculations and the address calculations performed in parallel therewith during said operations of performing the finite-field mathematical calculations and performing the address calculations.

21. In ECC (error correcting code) error-correcting apparatus for error-correcting a block of digital data encoded according to a selected encoding technique to include an ECC (error correcting code) portion, an improvement of a parallel processor for correcting data errors in the block of digital data, said parallel processor comprising:
    a finite-field ALU coupled selectively to receive an error-location indication and an error-syndrome indication, said finite-field ALU for performing finite-field mathematical calculations; and an integer ALU operable in parallel with said finite-field ALU, said integer ALU for performing address calculations, said finite-field ALU and said integer ALU together operable to correct data errors of data of the block of digital data, each of said finite-field ALU and said integer ALU reprogrammable responsive to changes in the selected encoding technique by which the block of digital data is encoded.

* * * * *